United States Patent [19]

King et al.

[11] Patent Number: 5,389,874
[45] Date of Patent: Feb. 14, 1995

[54] METHOD FOR CONTROL OF GROUND BOUNCE ABOVE AN INTERNAL GROUND PLANE IN A SHORT-WIRE BOARD TEST FIXTURE

[75] Inventors: Philip N. King; Carroll E. Morris, Jr., both of Fort Collins, Colo.

[73] Assignee: Hewlett-Packard Company, Palo Alto, Calif.

[21] Appl. No.: 31,092

[22] Filed: Mar. 15, 1993

Related U.S. Application Data

[63] Continuation of Ser. No. 762,521, Sep. 18, 1991, abandoned.

[51] Int. Cl.⁶ .............................................. G01R 1/073
[52] U.S. Cl. ..................................... 324/758; 364/488
[58] Field of Search ............ 324/158 P, 158 F, 158 R, 324/73.1; 364/488; 29/825, 832, 834, 842

[56] References Cited

U.S. PATENT DOCUMENTS

| | | | |
|---|---|---|---|
| 3,693,087 | 9/1972 | Adams et al. | 324/158 P |
| 4,565,966 | 1/1986 | Burr et al. | 324/158 F |
| 4,697,143 | 9/1987 | Lockwood et al. | 324/159 P |
| 4,740,746 | 4/1988 | Pollock et al. | 324/158 P |
| 4,818,933 | 4/1989 | Kerschner et al. | 324/158 F |
| 4,856,904 | 8/1989 | Akagawa | 324/158 F |
| 4,894,612 | 1/1990 | Drake et al. | 324/158 P |
| 4,935,696 | 6/1990 | DiPerna | 324/158 F |
| 4,965,514 | 10/1990 | Herrick | 324/158 P |
| 5,055,780 | 10/1991 | Takagi et al. | 324/158 P |

*Primary Examiner*—Ernest F. Karlsen

[57] ABSTRACT

An algorithm selects probe locations for both test signal probes and ground probes in a short-wire board test fixture. The board test fixture connects a test system to a circuit board under test. The algorithm minimizes ground bounce. The algorithm envisions first superimposing an imaginary grid of squares over the circuit board. Then, ground probe locations are derived so that no more than five test signal probes for each ground probe reside within each of the imaginary squares and so that each critical test signal probe is associated within a preselected distance of a ground probe. In the preferred embodiment, the imaginary square measure 1.4 inches on a side, and the preselected distance is approximately one inch.

7 Claims, 12 Drawing Sheets

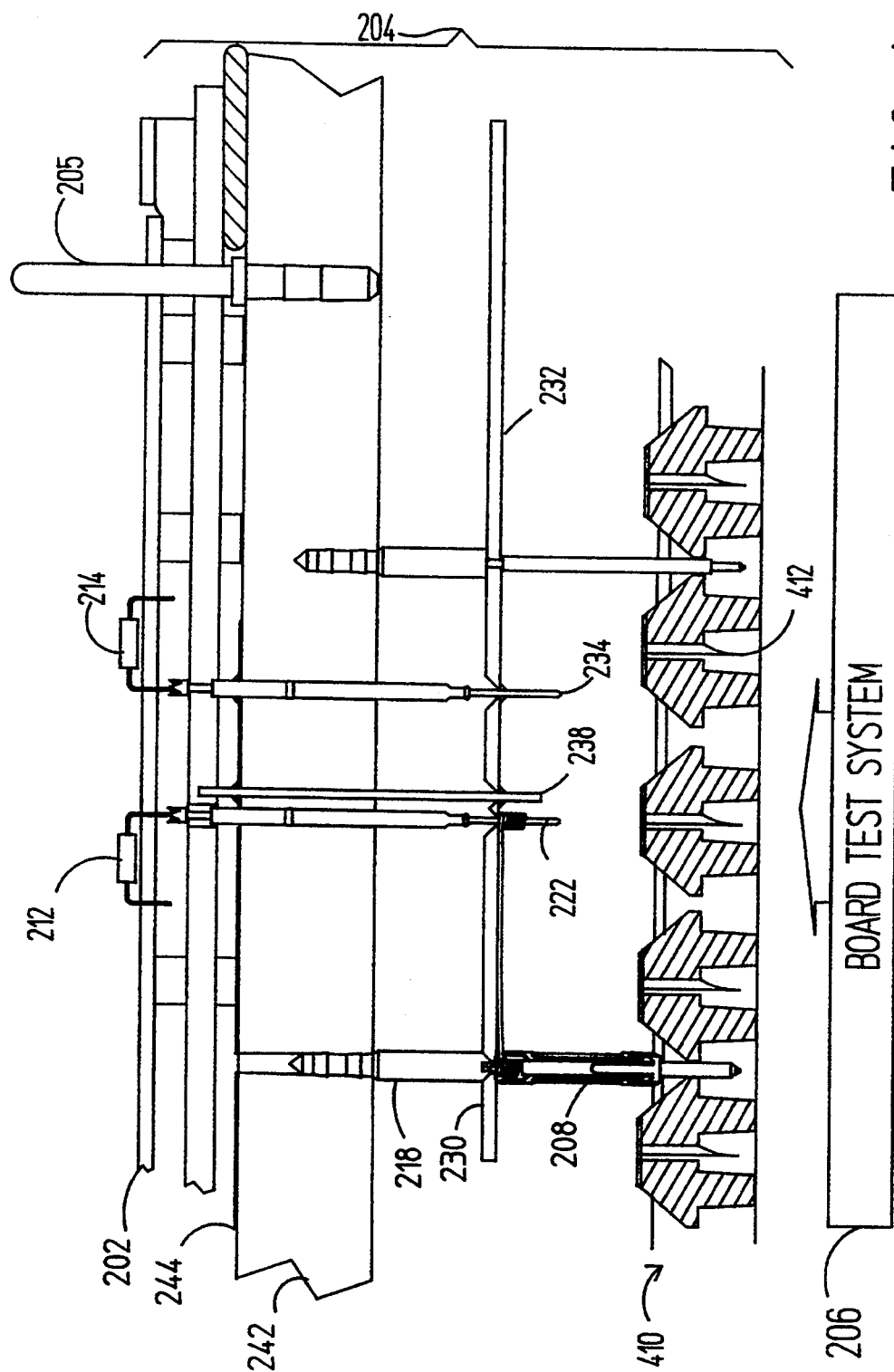

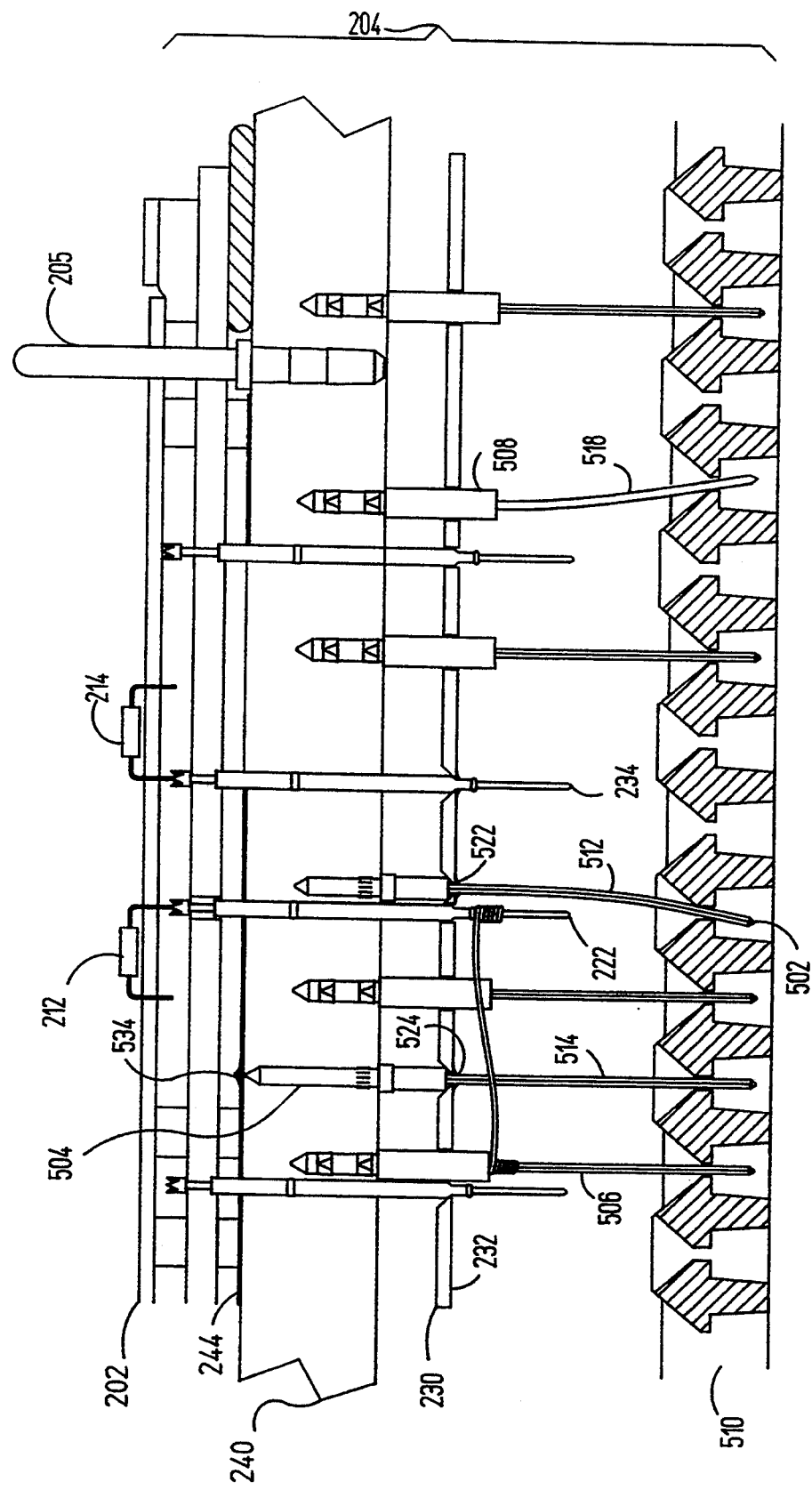

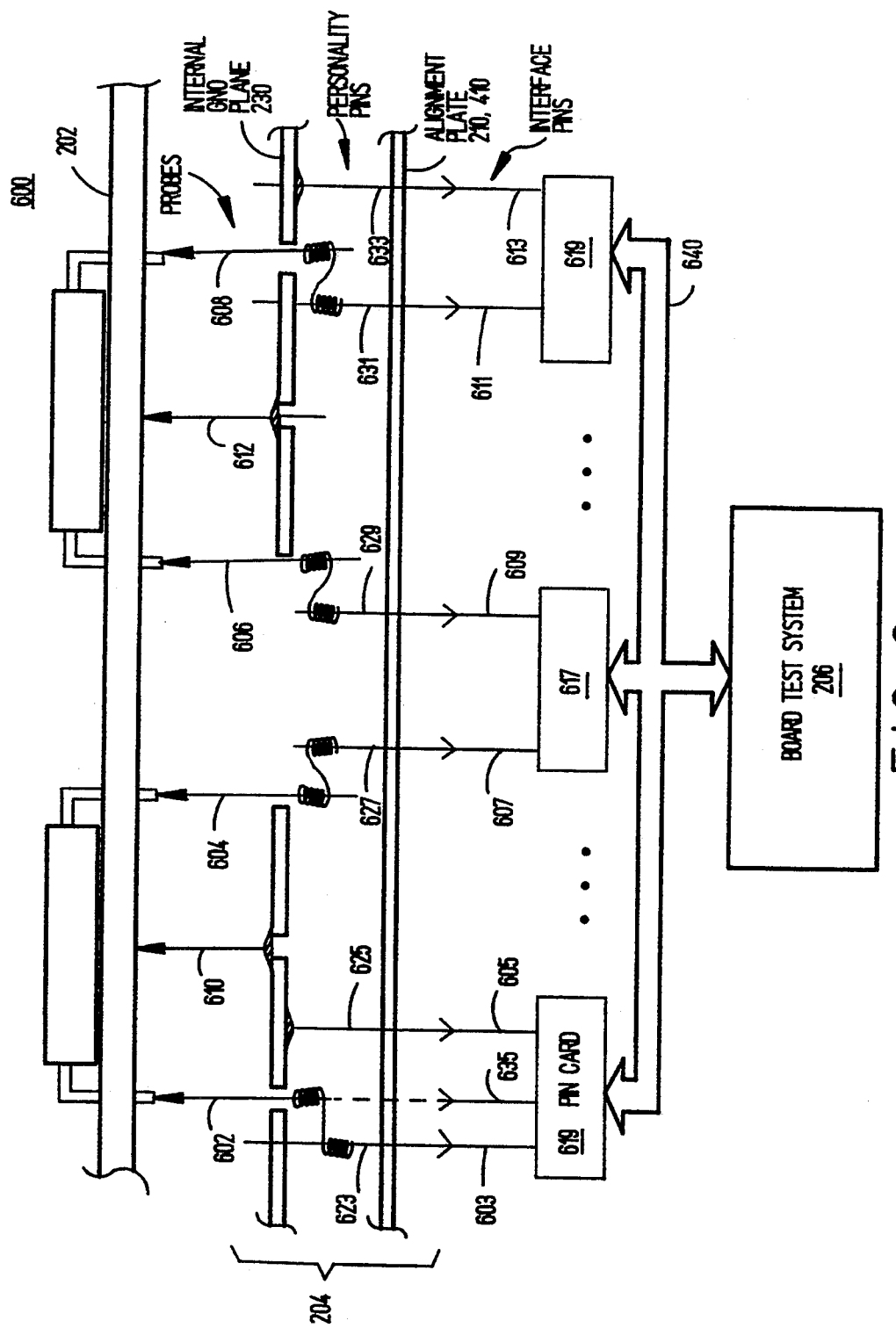

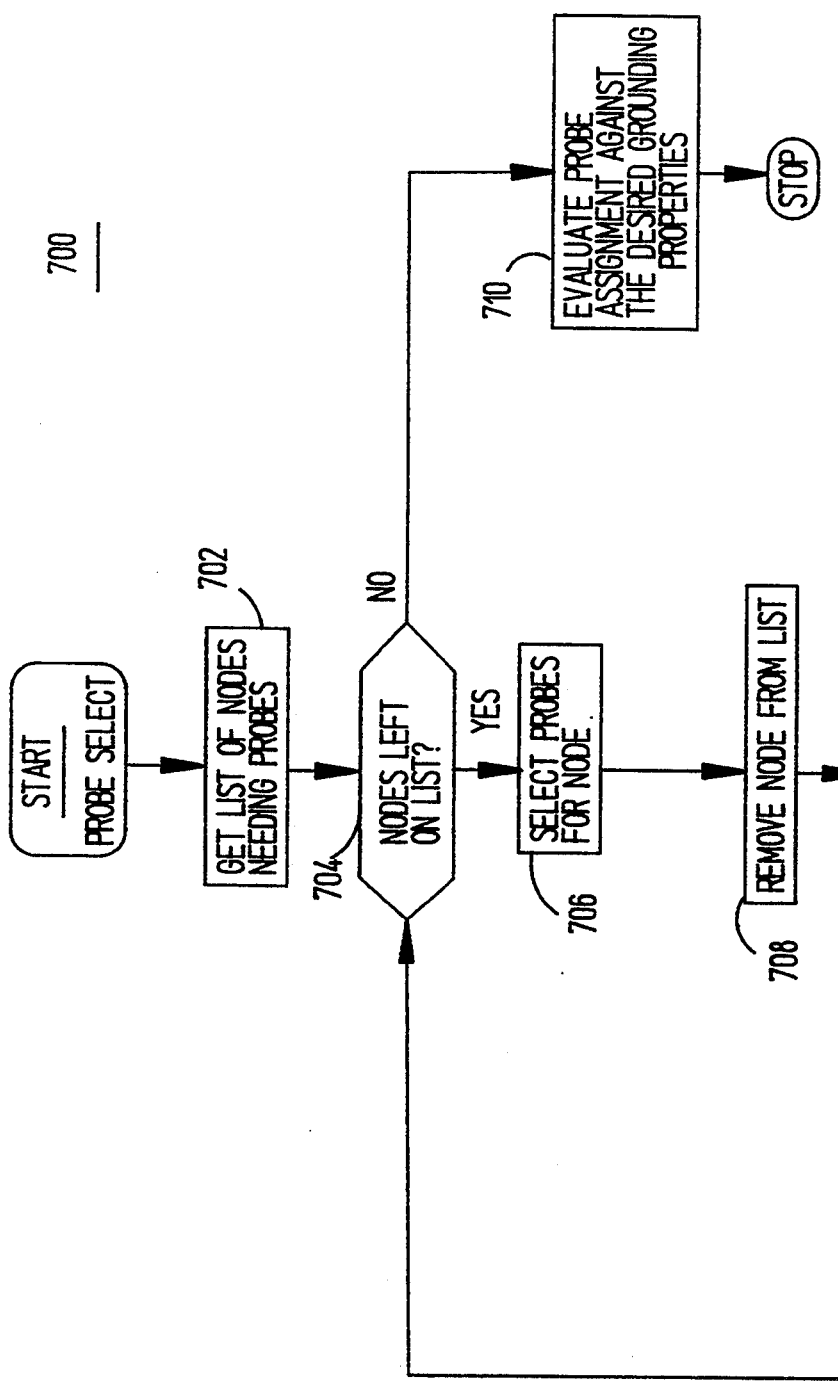

150
METHOD FOR CONTROL OF GROUND BOUNCE ABOVE AN INTERNAL GROUND PLANE IN A SHORT-WIRE BOARD TEST FIXTURE

CROSS REFERENCE TO RELATED APPLICATION(S)

This is a continuation of application Ser. No. 07/762,521, filed on Sep. 18, 1991, now abandoned.

BACKGROUND OF THE INVENTION

I. Field of the Invention

The present invention generally relates to the testing of electronic circuit boards and, more particularly, to board test fixtures and methods thereof for electrically interconnecting electronic circuit boards and the like to electrical test systems.

II. Related Art

A board test system consists of numerous electronic drivers (sources) and receivers (detectors) which are connected through an electronic switching mechanism, often referred to as a "scanner", to a plurality of contact points referred to as scanner pins. A board test fixture then provides an interface between these scanner pins and the electronic components located on an electronic circuit board. Because the electronic test signals which are used to determine whether the electronic component is operating properly must pass through the board test fixture both on their way to and from the electronic component, the board test fixture must maintain the signal quality of the test signals to ensure that the electronic component is not incorrectly diagnosed as operating either properly or improperly.

It has been recognized in the art that in order to ensure maximum test signal quality, the length of the signal path between the scanner and the electronic circuit board must be kept as short as possible. This factor normally dictates a short vertical coupling of the test system and the circuit board. In other words, a "short-wire" board test fixture is designed to sit directly on top of the scanner and the electronic circuit board directly on the board test fixture. Furthermore, any board test fixture must be easy to assemble and maintain in order to be readily usable and cost effective. Finally, the ability to automate the assembly of the fixture is also an important feature.

U.S. Pat. No. 4,799,007 to Cook et al., which is incorporated herein by reference, describes a board test fixture which provides short and reliable connections between a test system and a circuit board under test. The foregoing short-wire fixture provides for good signal fidelity with digital signals up to approximately 6 megahertz (MHz). However, due to electrical parasitics, signal fidelity begins to fall off above about 6 MHz, and the ability to accurately test can become difficult above around 12 MHz.

The electrical parasitics phenomenon is discussed with reference to FIG. 1. Electrical parasitics become apparent in the form of a phenomenum known in the art as "ground bounce" or voltage/current "spikes". Ground bounce is often caused by the quick transitioning of the outputs of the circuit board under test. As shown in FIG. 1 at reference 102, the various outputs of the circuit board under test are connected to the receivers of the test system via the board test fixture. Furthermore, as shown at reference 104, the inputs of the board under test are connected to driver outputs of the test system via the board test fixture. The board test fixture comprises wiring which is schematically shown in FIG. 1 as inductances $L_r$, $L_g$, $L_d$.

Now, in operation, when a circuit board output 106 switches, the receiver input current $I_r$ must pass through the fixture wiring to charge the input capacitance $C_r$ of the receiver 108. The capacitance $C_r$ comprises the actual receiver input capacitance in combination with the board trace capacitance. The magnitude of the charging current $I_r$ can be predicted from the following formula: $I_r = C_r * (dV_r/dt)$. Because the capacitance $C_r$ is largely fixed in the board test system, the primary determining factor in the magnitude of the current $I_r$ is the switching speed of the board output.

The current $I_r$ which flows from the board output to the test system must in some way return to the circuit board under test by some electrical path in order to satisfy Kirchoff's current laws. While a small part of the current $I_r$ may be returned by other paths, the majority of it will flow through the fixture ground wires, as indicated by reference 110 as a current $I_g$.

The ground current $I_g$ flowing through the fixture ground wiring will induce a voltage $V_g$ across the wire inductance $L_g$, wherein $V_g = L_g * (dI_g/dt)$. As indicated by the foregoing equation, the switching speed of the circuit board under test affects the voltage $V_g$ across the wire inductance $L_g$. In other words, the induced voltage $V_g$ appears between the circuit board ground and the test system ground, as shown.

A voltage difference between the two grounds, i.e., or ground bounce, has extreme adverse effects as described hereafter. The output voltage of the driver 112 is maintained at a constant level with respect to the test system ground (assuming that the driver 112 is not switching). The board inputs of the circuit board 114 exhibit very high impedance, so very little current $I_d$ will flow through the fixture wiring having inductance $L_d$. Thus, because the current $I_d$ is minimal, very little voltage $V_d$ is developed across the fixture wiring, pursuant to the aforementioned inductance equation. Moreover, the board input voltage will follow the driver output voltage, resulting in $V_g$ being impressed on the board input. When the ground bounce voltage is impressed on the board input, there is a risk of causing the input voltage to cross the logic threshold associated with the board input.

In the case of purely combinational logic circuit, the ground bounce predicament is not a severe risk, because a waiting period can be implemented to settle out the adverse effects. However, in the case of a sequential logic circuit for which this input is a clock or other state determining element, the state of the circuit is changed, and the test will fail no matter how slowly the test is advanced.

SUMMARY OF THE INVENTION

The present invention identifies the locations for test signal probes and ground signal probes in a short-wire board test fixture so as to minimize ground bounce. Pursuant to the present invention, an imaginary grid of squares is superimposed over the circuit board under test. Then, ground probe and signal probe locations are derived. In accordance with the present invention, the ground probe locations are selected so that no more than five test signal probes for each ground probe reside within each of the imaginary squares and so that each critical test signal probe is associated within a preselected distance of a ground probe. A critical test signal probe is a probe which carries a test signal which is susceptible to ground bounce, caused for example, by a test signal which transitions from one logic state to another at a fast rate.

The present invention provides for an excellent distributed ground system through the board test fixture to the circuit board under test.

Very high speed testing is permitted by minimizing any ground bounce. Signal fidelity through the board test fixture is adequate for test frequencies of over 50 MHz.

The present invention is particularly useful for assigning ground and test signal probes for the novel board test fixture(s) set forth in the copending application entitled "ENHANCED GROUNDING SYSTEM FOR SHORT-WIRE LENGHTED FIXTURE" having Ser. No. 07/741,719 to Cook el al., now U.S. Pat. No. 5,304,921, which is assigned to the assignee of the present application.

Further features and advantages of the present invention will become apparent to one skilled in the art upon examination of the following drawings and the detailed description. It is intended that any additional features and advantages be incorporated herein.

BRIEF DESCRIPTION OF THE DRAWINGS

The present invention, as defined in the claims, can be better understood with reference to the text and to the following drawings. The drawings are not necessarily to scale, emphasis being placed instead on clearly illustrating principles of the present invention.

FIG. 4 illustrates a second embodiment of a board test fixture wherein the ground system uses a ground comb and a coax assembly;

FIG. 5 illustrates a third embodiment of a board test fixture wherein the ground system uses ground personality pins;

FIG. 6 shows a high level block diagram of a generic board test fixture connecting a circuit board under test to a board test system wherein ground and test signal probes above an internal ground plane within the board test fixture are spatially situated in accordance with the present invention;

FIG. 7 illustrates a high level flowchart for the assignment of test signal probes and ground probes in the generic board test fixture of FIG. 6;

DETAILED DESCRIPTION OF THE PREFERRED EMBODIMENT

I. Board Test Fixtures

FIGS. 2-5 illustrate several embodiments of board test fixture(s) set forth in the copending application entitled "ENHANCED GROUNDING SYSTEM FOR SHORT-WIRE LENGHTED FIXTURE" having Ser. No. 07/714,719, now U.S. Pat. No. 5,304,921 to Cook et al., which is assigned to the assignee of the present application. The present invention is envisioned for particular use in these embodiments, and accordingly, the foregoing document is incorporated herein by reference. However, it should be noted that the present invention is applicable to other board test fixture designs.

Figure 1:
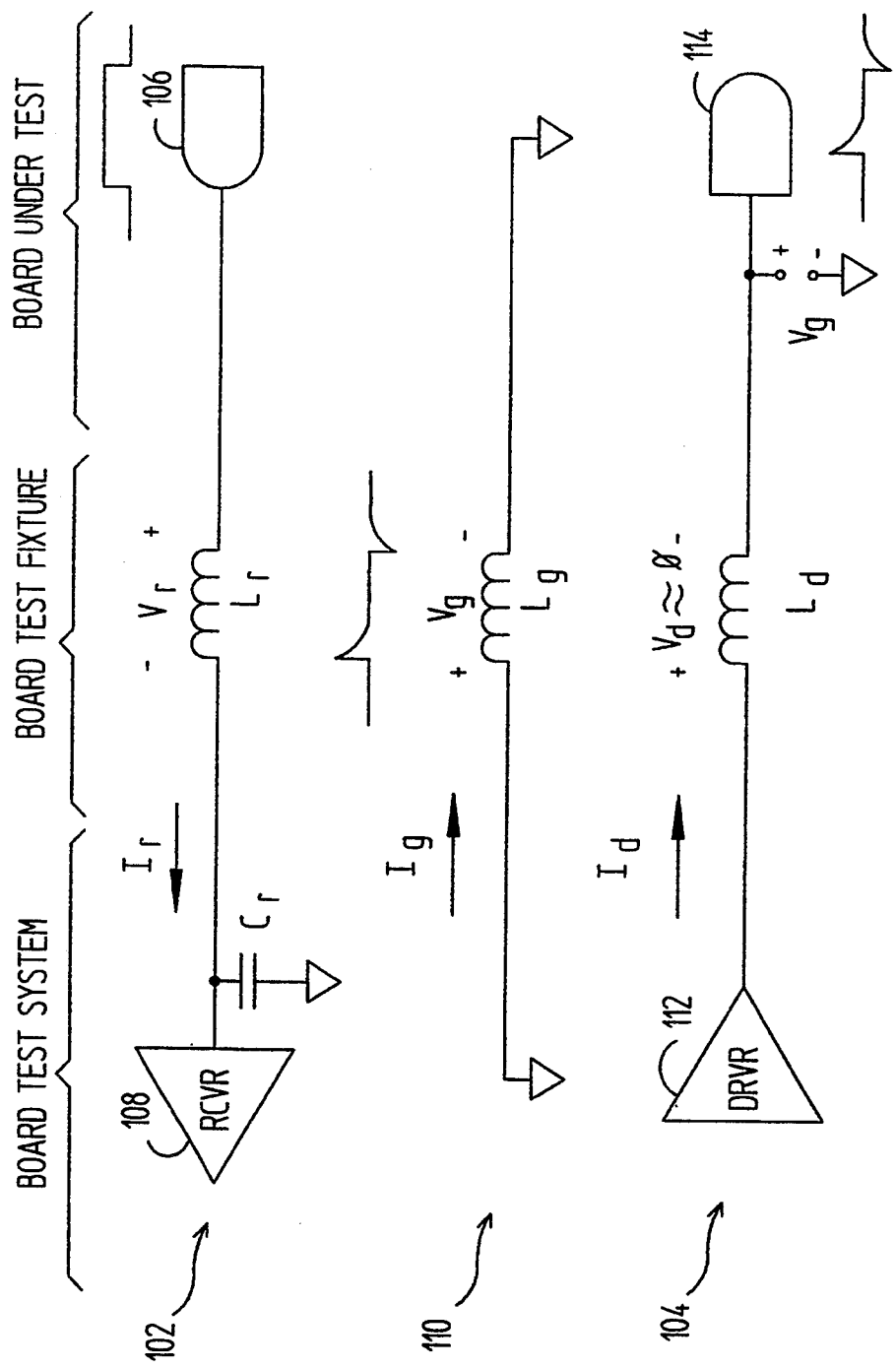
FIG. 1 illustrates the electrical ground bounce problem solved by the present invention.
Figure 2:
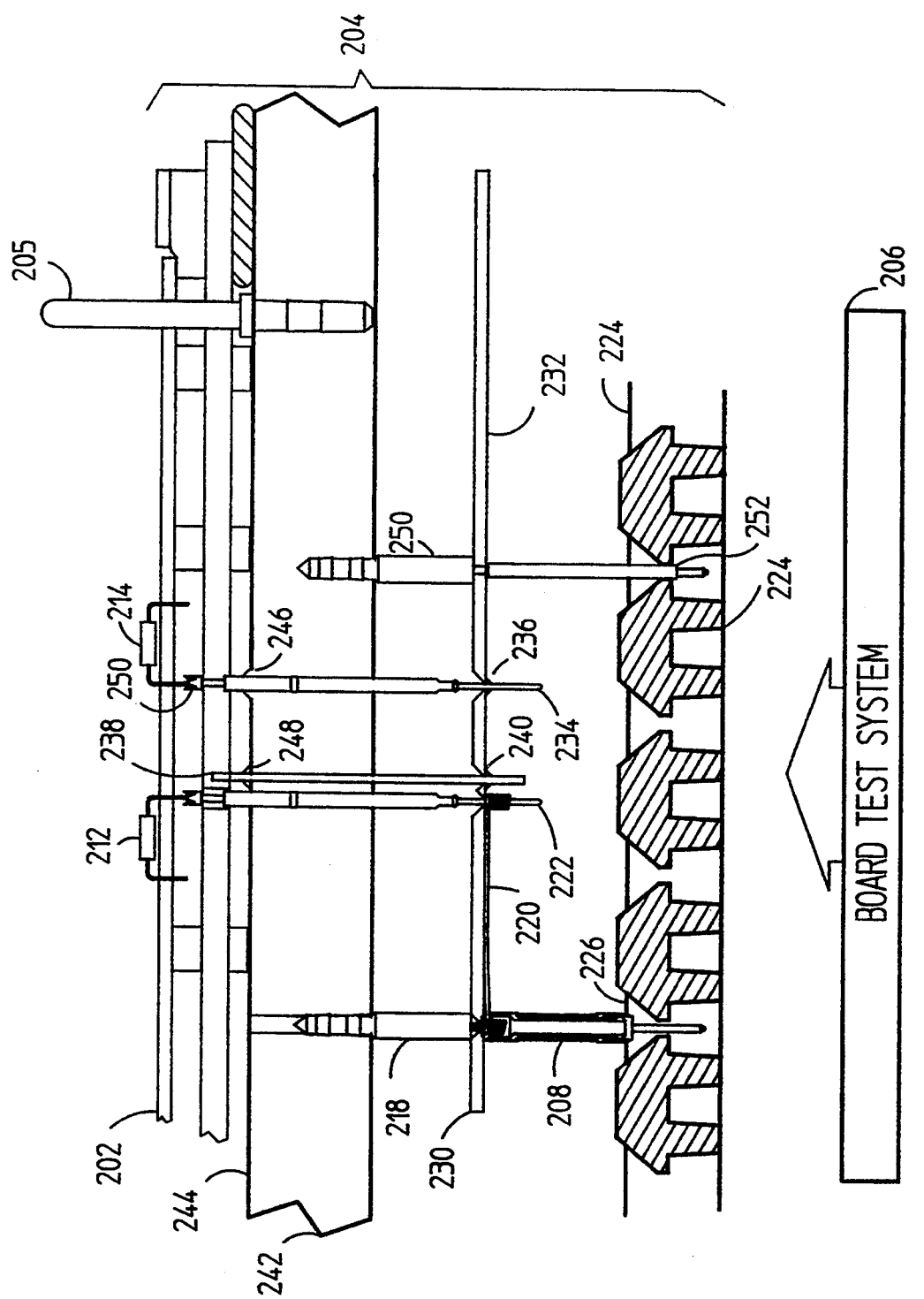
FIG. 2 shows a first embodiment of a board test fixture wherein a ground system uses a plated alignment plate and a coax assembly.

FIG. 2 shows a first embodiment of a board test fixture. As shown in FIG. 2, a circuit board 202 to be tested is placed on top of a board test fixture 204 via the guidance of an alignment pin 205. The board test fixture 204 provides an electrical interface between the circuit board 202 and the board test system 206. In other words, many test signals travel through the board test fixture 204.

The first embodiment envisions implementing a grounding system which utilizes ground coax assemblies 208 and a plated alignment plate 210 in the board test fixture 204, as are described in detail below. The grounding system permits testing of the circuit board 202 at very high speeds.

Various test signal paths travel from the board test system 206 through the board test fixture 204 to electronic components 212,214 on a circuit board 202 under test. As shown in FIG. 2, for example, a test signal from the board test system 206 travels through the wire-wrapping pin 216 of a personality pin 218, through a wire 220, and then through a signal probe 222, respectively, before reaching the electronic component 212. The location of the personality pins and the signal probes as well as the length of their connecting wires changes depending upon the orientation of electronic components 212,214 on the circuit board 202 under test.

Various ground paths also travel through the board test fixture 204 between the circuit board 202 under test and the board test system 206. Ground connectors from the board test system 206 contact the bottom of the board test fixture 204 in order to make the ground path available to the fixture 204.

At the bottom of the fixture 204 is the alignment plate 210, which serves as a focus means to capture and guide personality pins 218, which carry test signals, into an organized orthogonal array-like pattern when the alignment plate 210 is installed so that the board test system 206 can send test signals through the fixture 204.

However, the alignment plate 210 further serves as a ground conductance means. It comprises an inner nonconductive support material 223 and a conductive outer plating 224 on all of its exposed surface areas, including the top, bottom, and throughways. The plating 224 is preferably a metal. In the embodiments, the metal is a combination of copper and nickel or a combination of copper, nickel, and gold, in order to provide an excellent transitional ground path from the board test system 206 to the top 226 of the alignment plate 210. The plated alignment plate 210 provides a good impedance control because it positions the ground path near the signal paths.

In order to provide the ground path from the top 226 of the alignment plate 210 upward through the board test fixture 204 while maintaining the ground near the signal paths, the coax assembly 208 is positioned concentrically around each signal path, specifically each personality pin, which carries a signal posing a potential ground bounce problem. Such signal paths are called "critical" signal paths. The critical signal paths are usually those paths which carry electrical signals which switch at a high speed.

Figure 3A:
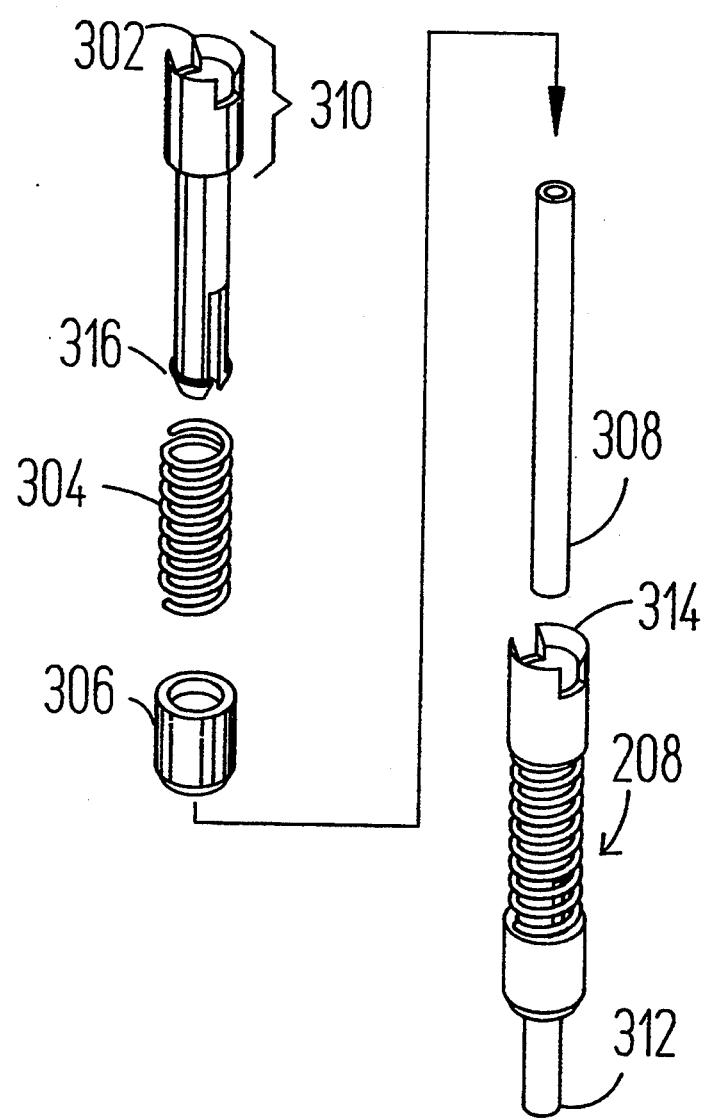
FIGS. 3a and 3b show a coax assembly for personality pins.
Figure 3B:
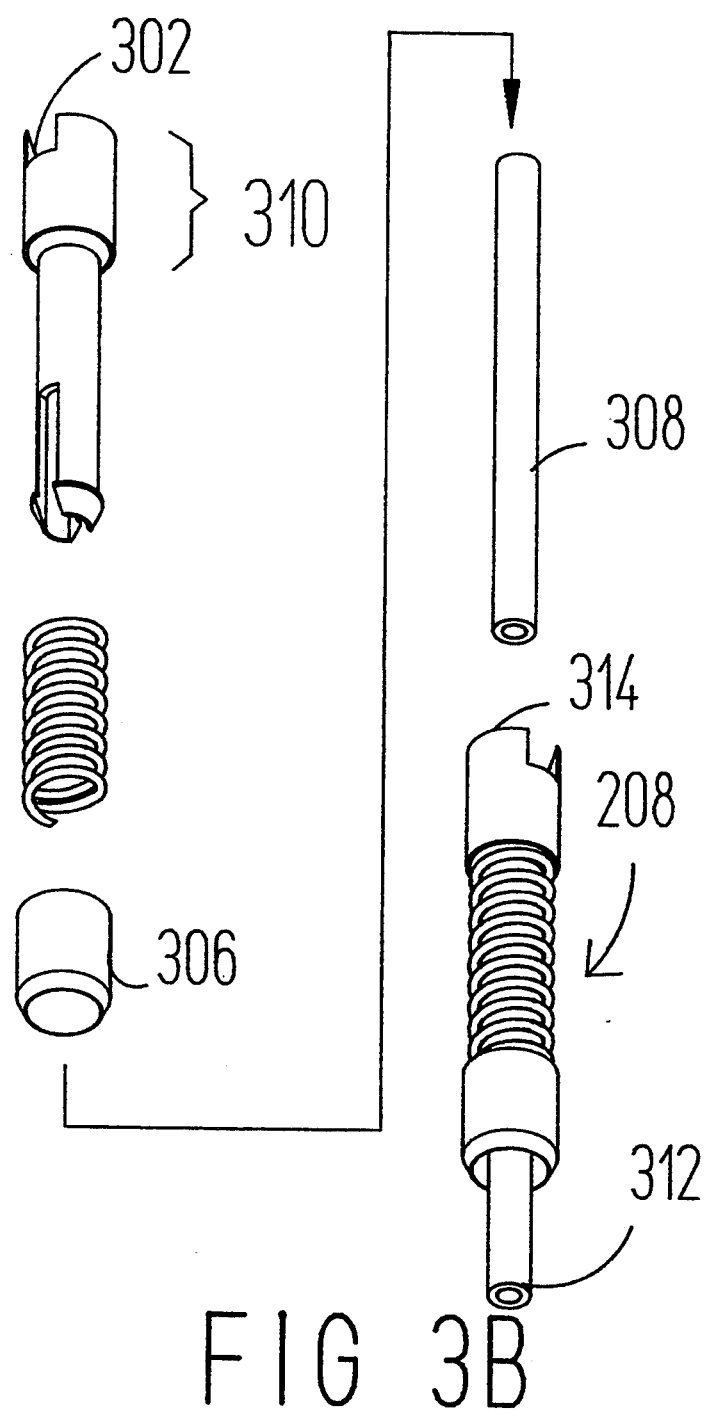

The ground signal carried by the coax assembly 208 is isolated from the internal wire-wrap pin 216 via a piece of plastic tubing 228. As shown in FIG. 2, the plastic tubing 228 extends from the wire wrap at the base of the wire-wrap pin 216 to just short of the tip of the pin 216. The plastic tubing 228 extends down through the plated alignment plate 210 in order to prevent the pin 216 from contacting the plating 224, thereby tainting the test signal on pin 216. FIGS. 3(a) and 3(b) show in detail the ground coax assembly 208.

As shown in FIGS. 3(a) and 3(b), the ground coax assembly comprises a conductive, internal coax sleeve 302, a spring 304, a conductive, external coax sleeve 306, and a plastic insulator 308. The sleeve 302 is notched, as shown, so as to permit access of the a wire to the enclosed personality pin. The wire wrap would be enclosed by the enlarged region 310. Further, the bottom part 312 and the top part 314 of the coax assembly 208 are forced apart by the compression spring 304. A stop 316 is designed to catch the external coax sleeve 306 to prevent the coax assembly 208 from coming completely apart.

With reference again to FIG. 2, the top part 314 of the coax assembly 208, which has sharp edges, is pressed against an internal ground plane 230 mounted inside the board test fixture 204 by the spring 304. The bottom part 312 of the coax assembly 208 is forced by the spring 304 against the metal plating 224 of the alignment plate 210 described above. The internal ground plane 230 has plating 232 at its underside only and is located near the base of the wire-wrap pin 216.

The signal wire 220, which passes between the notch at the upper part 314 of the coax assembly 212, is routed in very close proximity to the internal ground plane 230 in order to provide strip line impedance control for the critical signal wire. It should be noted that once the wire 220 leaves the plating 232 of the internal ground plane 230 by more than ½ a wire diameter, or so, the impedance adversely rises quickly.

From the plating 232, the ground signal is provided to the circuit board 202 via the various ground probes and various ground pins which are soldered to the plating 232. As illustrated in FIG. 2, a ground probe 234 is soldered to the plating 232 at a point 236. Moreover, a small ground pin 238 is soldered to the plating 232 at a soldering point 240. Both the ground probe 234 and the ground pin 2,38 carry the ground signal through a probe plate 242 to an external ground plane 244, which is optional. As shown, the ground probe 234 and the ground pin 238 are soldered to the external ground plane 244 at respective soldering points 246 and 248. Further note that, unlike the ground pin 238, the ground probe 234 extends further upward in order to contact the ground on the electronic component 214 in a direct manner to make an electrical contact 250.

Care is taken so that the small ground pin 238 is associated in close proximity to the signal probe 222. This close association helps substantially in controlling impedance. A number of small ground pins could be clustered around a critical signal path if warranted.

Worth noting is that if a high degree of impedance control is not required in the test fixture 204, the external ground plane 244 and the array of small ground pins, such as the ground pin 238, may be conveniently eliminated from the structure. Such a simplified fixture would be cheaper and much easier to construct.

Finally, for those personality pins which do not have a corresponding coax assembly 208, an insulator, such as for example the plastic insulator 308, is provided to surround the corresponding wire-wrap pin so that it does not contact the plating 224 on the alignment plate 210. As shown in FIG. 2, the personality pin 250 is concentrically surrounded along its axis by an insulator 252.

FIG. 4 illustrates a second embodiment of a board test fixture. The second embodiment is similar to the first embodiment of FIG. 2 in many respects. However, the alignment plate 4 10 of FIG. 4 does not comprise a conductive outer plating, as does the alignment plate 210 of FIG. 2.

Instead, the alignment plate 410 comprises a ground comb 412, which is a sheet metal part placed, bonded, or affixed in some fashion, onto the alignment plate 410. In the second embodiment, the ground comb 4 12 is affixed to the alignment plate 410 via a snap-fit arrangement. In the snap-fit arrangement, the ground comb 412 comprises one or more protruding parts which snap into the alignment plate 410 to thereby hold the ground comb 412 contiguous to the alignment plate 410.

Essentially, the ground comb 412 communicates the ground from the board test system 206 through the alignment plate 4 10 to any coax assemblies 208. It should be noted that the plated alignment plate 210 of FIG. 2 provides slightly better impedance control than the combination of the ground comb 412 and alignment plate 410 of FIG. 4 because it generally provides a ground path more closely coupled to the signal paths. However, the plated alignment plate technique is more expensive than the ground comb technique. Consequently, a cost versus performance analysis must be performed in order to select the best option for a particular embodiment.

FIG. 5 shows a third embodiment of the board test fixture 204 wherein an array of ground personality pins 502,504 are implemented in order to control impedance through the board test fixture 204. The array of ground personality pins 502,504 are intermixed among the array of test signal personality pins 506. The ground personality pins 502,504 can be clustered, if desired, around critical signal paths to more efficiently control impedance.

The ground personality pins 502,504 are mounted in the probe plate 240 and their wire-wrap pins 512,514 are then soldered to the internal ground plane 230, as indicated at reference numerals 522,524. The ground personality pins 502,504 are made available to the board test system 206 via an alignment plate 510.

The alignment plate 5 10 is essentially composed of a non-conductive plastic material. The alignment plate 510 essentially serves as a focus means to capture and guide both the ground personality pins 502,504 and the test signal personality pins 506 into an organized orthogonal array-like pattern when the alignment plate 510 is installed, so that the board test system 206 has easy access to both types of pins at the bottom of the board test fixture 204.

To this end, the ground personality pins 502,504 as well as the test signal personality pins 506,508 may bend, as shown by respective wire-wrap pins 512,518 in order to pass through the alignment plate 510 to the board test system 206.

In accordance with another aspect of the third embodiment, the metal bodies of the ground personality pins 502,504 may extend out past the top of the probe plate 240, where their top ends may be soldered to the external ground plane 244, thus further controlling impedance. FIG. 5 illustrates the ground personality pin 504 with its metal body extended and soldered to the external ground plane 244, as indicated by reference numeral 534. As with the other previously-mentioned embodiments, it should be emphasized that the external ground plane 244 is an optional feature of the embodiments. If the external ground plane 244 is not needed, the bodies of the ground personality pins 502,504 need only be long enough to press into the probe plate 240. Needless to say, in this case, the bodies of the ground personality pins 502,504 need not be conductive.

The holes in the internal ground plane 230 for the ground personality pins 502,504 can be sized in order to allow soldering to the internal ground plane 230. If too much hole clearance exists, soldering can be difficult. In contrast, clearance for test signal personality pins 512 need to be great enough to guarantee that the pins 512 will not accidentally touch the plating 232 of the internal ground plane 230. Furthermore, in order to help capture all of the ground personality pins 502,504 at once when the internal ground plane 230 is installed, the small clearance holes in the internal ground plane 220 should be countersunk, as shown.

ASSIGNING THE LOCATION OF SIGNAL AND GROUND PROBES

FIG. 6 shows a high level block diagram of the board test fixture 204 connecting the circuit board 202 under test to the board test system 206 and having test signal probes 602,604,606,608 and ground probes 610,612. The ground probes 610,612 carry ground signals between the circuit board 202 and the internal ground plane 230.

The quantity and spatial orientation of the test signal probes 602,604,606,608 and ground probes 610,612 are determined to minimize ground bounce in accordance with the present invention. This is accomplished in the preferred embodiment using sophisticated algorithms implemented in software. However, it should be noted that the algorithms could be implemented using a hardware approach or a hardware/software approach. Moreover, it should be further noted that the quantity and location of the test signal probes 602,604,606,608 and ground probes 610,612 can be determined in many different ways, perhaps, even at random, in order to control ground bounce. As determined by the inventors, the gist of any methodology should involve situating, perhaps clustering, ground probes 610,612 near test signal probes 602,604,606,608 carrying critical test signals to thereby minimize ground bounce.

An existing software program called "Probe Select", which has been designed and commercially distributed by the Hewlett-Packard Company, Inc., Loveland, Colo., USA, determines where to position the probes on the circuit board 402 under test. The existing Probe Select program takes into consideration certain criteria when determining the placement of probes. These criteria are highly dependant upon the particular circuit board 202 under test and, generally, are as follows: blockage of testing resources if a signal probe is positioned in a certain location, physical proximity of the signal probes, and others. The operation of the existing Probe Select program as well as the criteria considered during operation of the program are set forth in the 12-volume publication entitled, *HP 3070 Board Test System, User's Documentation Set*, HP Part No. 44930A (1989), which is incorporated herein by reference. Specifically, see § 5.3.2 of Volume 2.

During operation in the existing Probe Select program, the program isolates electrical nodes, e.g., a soldering point or strip, on the circuit board 202 and then determines where to position a probe on the electrical node. During this procedure, the Probe Select program assigns a "score" to all the potential probing locations on the electrical node. In the preferred embodiment, the score is just a number. The magnitude of the score is a measure of how well the particular probing location conforms to the criteria which the Probe Select program considers important. The score for a probing location is increased every time the Probe Select program discovers a detrimental feature in regard to the probing location. Accordingly, probing locations with low scores are better choices for signal probes than locations with high scores. After evaluating the scores for all probing locations on the electrical node, the Probe Select program positions the signal probe at the location with the low score.

It should be noted that for ground nodes on the circuit board 202, the inventors have determined that usually more than one ground probe is desirable in order to control ground bounce. However, multiple ground probes for a ground node is not a requirement.

For ground probes, the existing Probe Select program can make up to three passes through a list of probing locations in an attempt to acquire the highest number of probing locations which meet the specified criteria. First, the existing Probe Select program passes through the list and selects all probing locations on the electrical node whose score is below a preselected "first score threshold". Before executing another subsequent pass, a check is made against a preselected "first count threshold" to determine whether enough probing locations have already been selected. If not enough have been selected, then the existing Probe Select program passes again through the probing locations and selects those probing locations whose score is below a preselected "second score threshold", which is somewhat higher than the first score threshold. Before executing another subsequent pass, a check is made against a preselected "second count threshold" to determine whether enough probing locations have already been selected. If not enough have been selected, then the existing Probe Select program passes again through the probing locations and selects those probing locations whose score is below a preselected "third score threshold", which is even higher than the second score threshold. Notwithstanding the foregoing count and score thresholds, it should be noted that certain probing locations are so bad, in terms of the important criteria, that they can never be used as probes, even though they are the only probing locations available on the electrical node.

In accordance with the present invention, the existing Probe Select program has been modified to assign the location of the ground probes 610,612 in a different manner. In the present invention, the score for ground probing locations is computed using a different set of criteria, and also, a different set of count thresholds is used in regard to the number of selected probes.

The new set of criteria considered by the modified Probe Select program in the preferred embodiment when evaluating ground probing locations are as follows: (1) sufficient ground probes must exist to carry the power supply current used to power the circuit board 202 under test; (2) each ground probe should reside within one inch of every signal probe on an electrical node carrying a critical signal and (3) if an imaginary grid of 1.4"*1.4" is superimposed over the circuit board 202, no more than 5 signal probes for each ground probe should reside within a square. Note that criterion (1) above is performed in the existing Probe Select program, whereas criteria (2) and (3) are taught by the present invention. The foregoing criteria will be referred to hereafter during the description of the preferred embodiment. Moreover, these criteria were derived by the inventors via experimentation and ensure that a good electrical connection exists between the ground in the circuit board 202 and the internal ground plain 230 of the board test fixture 204.

The specific methodology in accordance with the preferred embodiment for determining the location of ground probes will now be described with respect to FIGS. 6–11. FIG. 7 illustrates a high-level flowchart 700 pertaining to the modified Probe Select program. Excepting the functionality as indicated in a flowchart block 710, the program structure of FIG. 7 substantially resembles the existing Probe Select program.

As indicated in the flowchart block 702, a list of electrical nodes needing probes is retrieved, or inputted into the modified Probe Select program.

Next, at a flowchart block 704, the methodology envisions cycling through a logic loop in order to consider each electrical node on the list. Consequently, at the flowchart block 704, an electrical node is retrieved from the list. Then, at a flowchart block 706, the probing locations are selected for the particular electrical node. Both signal probing locations and ground probing locations are specified. The selection of the probing locations is described hereinafter in detail with respect to the FIGS. 8–11. With reference back to FIG. 7, after the probing locations have been determined and specified, the electrical node is then removed from the list, as indicated by a flowchart block 708. Furthermore, another node is retrieved from the list, if any remain, as indicated by the flowchart block 704, and the procedure continues until all nodes have been considered.

After all nodes on the circuit board 202 have been analyzed, the methodology shown in flowchart 700 performs a final check as to whether the fixture 204 satisfies the criteria (2) and (3), mentioned above. In those cases where either of the criteria (2) or (3) is not satisfied, a warning to this effect is given to the program's user, but the modified Probe Select program makes no attempt to rectify the situation by adding more ground probes and/or moving test signal probes 602,604,606,608. Finally, the operation of the modified Probe Select program is concluded with all test signal and ground probing locations being specified.

Figure 8:
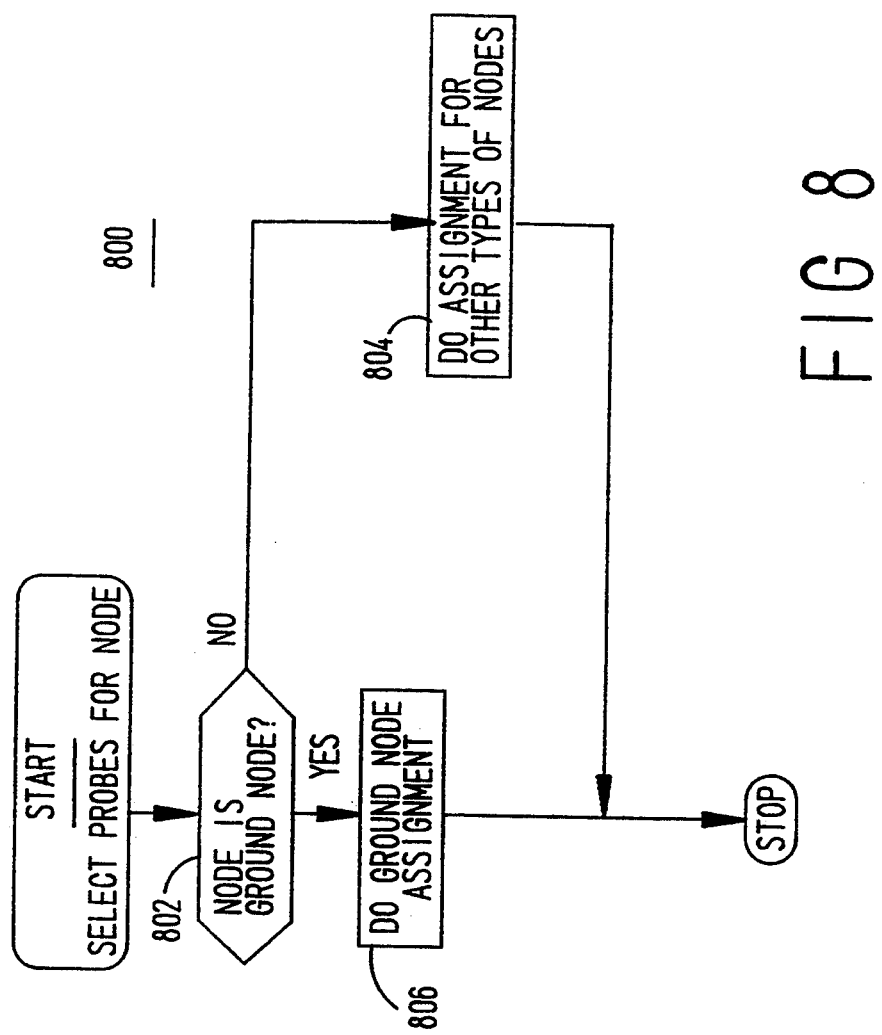
FIG. 8 shows a flowchart for selecting test signal and ground probes for an electrical node on a circuit board under test, as specified by the flowchart of FIG. 7.

FIG. 8 shows a high-level flowchart 800 pertaining to the methodology for selecting probing locations for each ground node at issue, whether it be a test signal or ground node. Recall that the selection of probing locations for an electrical node is specified in the flowchart block 706 of FIG. 7. The new program structure shown in FIG. 8 substantially resembles the existing Probe Select program.

With reference to flowchart block 802 of FIG. 8, it is first determined whether the node at issue is a ground node. If the node is not a ground node, then assignment of a test signal probe is performed as indicated in flowchart block 804. In the preferred embodiment, the test signal probes are assigned just as they are in the existing Probe Select program.

However, at the flowchart block 802, if the electrical node is a ground node, then the methodology envisions assigning ground probing locations to the ground node, as indicated in a flowchart block 806. The assignment of ground probing locations is discussed hereafter in detail in regard to FIG. 9.

Finally, after either the flowchart block 804 or the flowchart block 806, the methodology envisions returning to the flowchart block 706 of FIG. 7 in order to have the node removed from the node list and to retrieve another node.

Figure 9:
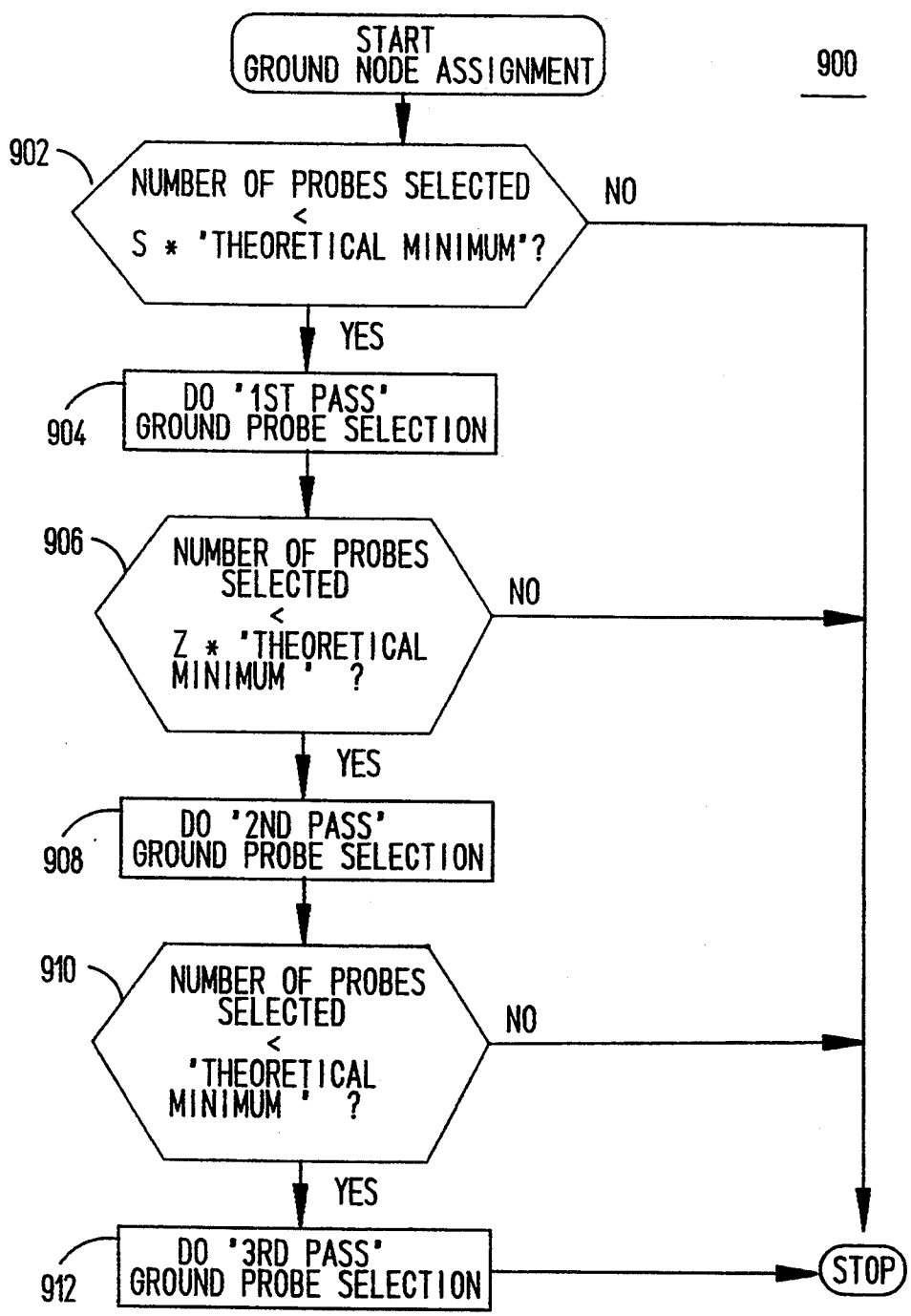
FIG. 9 shows a flowchart for assigning ground nodes, as specified by the flowchart of FIG. 8.

FIG. 9 illustrates a flowchart 900 pertaining to the assignment of ground probing locations to ground nodes, as specified in the flowchart block 806 of FIG. 8. The new program structure shown in FIG. 9 substantially resembles the existing Probe Select program.

As illustrated in FIG. 9, at a flowchart block 902, a check is made to determine if enough ground probing locations have already been identified for the ground node at issue. At a flowchart block 902, it is determined whether the number of ground probing locations selected is less than a preselected first count threshold. The first count threshold is novel. The first count threshold in accordance with the present invention is defined and computed as follows:

first count threshold = 5 * theoretical minimum

Furthermore, in accordance with the present invention, the "theoretical minimum" is defined and computed as follows:

$$\text{theoretical minimum} = \frac{\text{number of test signal nodes}}{5} + \text{power supply needs}$$

The above equations for computing the theoretical minimum and the first count threshold as well as all other novel count thresholds discussed in this document were derived through extensive effort and experimentation on the part of the inventors. Further, the theoretical minimum was derived in accordance with the present invention from the following observations: (a) a maximum signal-to-ground ratio of 5:1 cannot be achieved in every imaginary grid square as required by factor (3) above, unless the signal-to-ground ratio on the circuit board 202 is no more than 5:1 overall; (b) a minimum number of ground probes is needed for power supply current, as mentioned previously; and (c) each test signal node on circuit board 202 has only one test signal probe associated with it.

A more general computation of theoretical minimum is also envisioned wherein any number of test signal probes is associated with each test signal node on the circuit board 202. More specifically, the theoretical minimum in accordance with the present invention would be computed as follows:

$$\text{theoretical minimum} = \frac{\Sigma \text{ test probes desired on test signal node } (i)}{5} + \text{power supply needs}$$

wherein the summation ($\Sigma$) is taken over all test signal nodes (i).

If it is determined that the number of ground probing locations is greater than or equal to the first count threshold, then the number is sufficient, and the flowchart 900 will stop, as shown. Alternatively, if it is determined that the number of ground probing locations selected is less than the first count threshold, then the number is insufficient, and the methodology envisions performing another pass ("first pass") through the ground probing locations. The ground probe selection taking place in flowchart block 904 is discussed in specific detail in FIG. 10 and is reserved for discussion hereinafter.

After the first pass has occurred, a second check is made to determine whether enough ground probing locations have been selected, as indicated in a flowchart block 906. The second check involves determining whether the number of selected ground probing locations is less than a preselected second count threshold. The computation of the second count threshold is novel. It is defined and computed as follows:

second count threshold = 2 * theoretical minimum

If the number of selected ground probing locations is not less than (i.e., greater than or equal to) the second count threshold, then the number is sufficient, and the methodology envisions stopping and returning to flowchart block 806 of FIG. 8. In the alternative, if the number is less than the second count threshold, then the methodology envisions performing another pass ("second pass") through the ground probing locations, as indicated by a flowchart block 908. As mentioned, ground probe selection is described in detail with respect to FIG. 10.

Referring back to FIG. 9, after the second pass has been performed, the number of selected ground probing locations is compared to a third count threshold. The computation of the third count threshold is novel. The third count threshold is computed as follows:

third count threshold = 1 * theoretical minimum

If the number of selected ground probing locations is not less than (i.e., greater than or equal to) the third count threshold, then the methodology envisions stopping and returning to flowchart block 806 of FIG. 8. Alternatively, if the number of selected ground probing locations is not sufficient, then the methodology envisions performing a still another pass ("third pass") through the ground probing locations, as indicated by a flowchart block 912. Again, ground probe selection is specified in FIG. 10.

Figure 10:
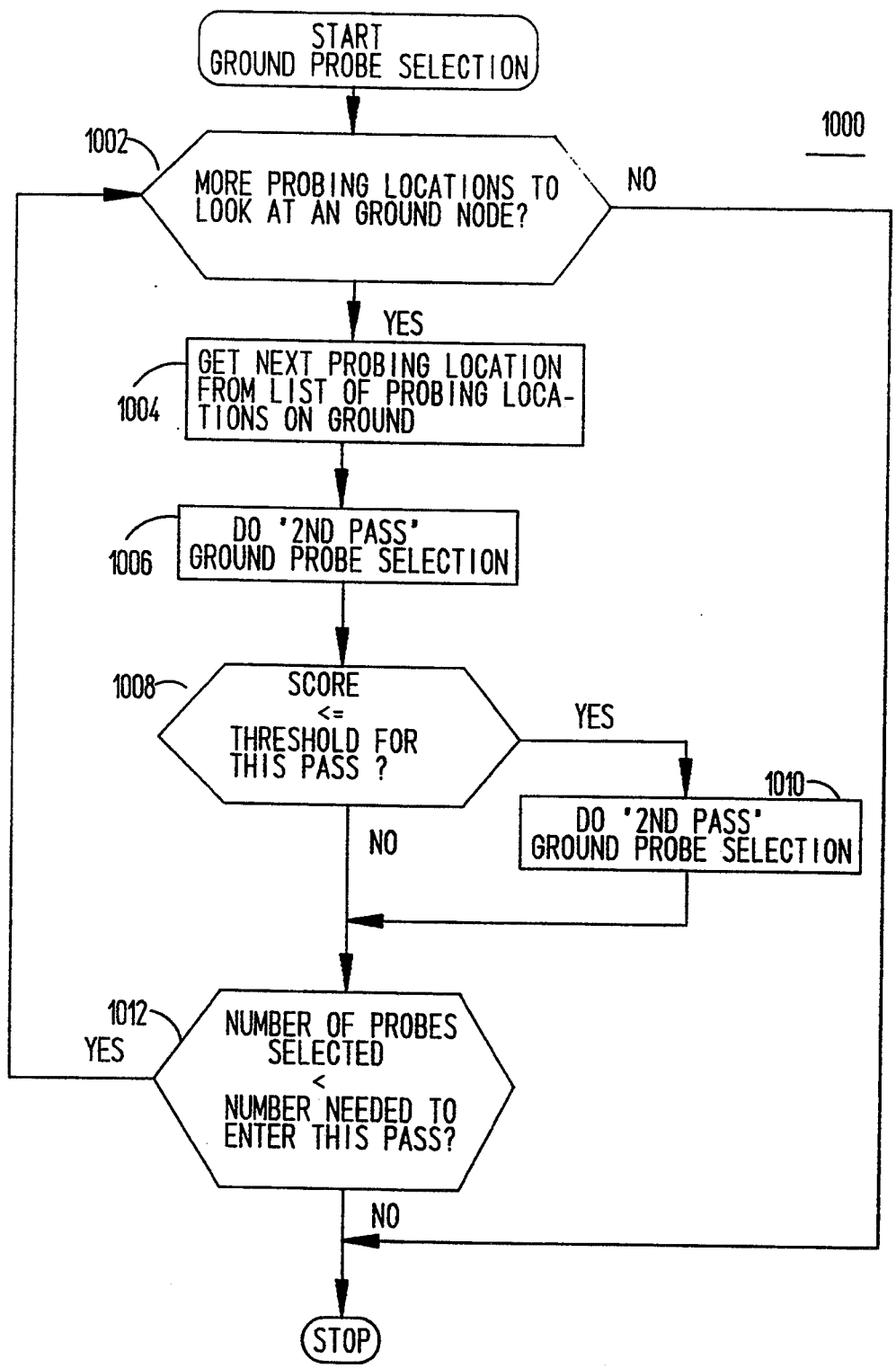
FIG. 10 illustrates a flowchart for selecting ground probes for a ground node, as specified by the flowchart of FIG. 9.

Referring to FIG. 10, ground probe selection begins at a flowchart block 1002. It should be noted that the structure of the flowchart 1000 resembles that of the existing Probe Select program.

At the flowchart block 1002, it is determined whether all ground probing locations have already been considered. If no ground probing locations exist for consideration, then the methodology envisions stopping and returning to the flowchart block 904, 909, or 912, whichever the case may be. Alternatively, if a probing location remains to be considered, then the probing location is retrieved from the list, as indicated in a flowchart block 1004.

At a flowchart block 1006, the score for the ground probing location at issue is computed. The computation of the probe score is novel and is geared toward distributing the ground probes in such a way so as to satisfy factor (3), mentioned above, of the present invention. To compute the score, the modified Probe Select program superimposes a 1.4"*1.4" imaginary grid over the circuit board 202 under test and keeps track of the number of test signal and ground probes within each square on the imaginary grid. The computation of the score will be discussed in more detail in regard to FIG. 11 hereafter.

After the score has been computed, it is determined whether the score is less than the predetermined score threshold corresponding to the particular pass. For example, if the flowchart 1000 had been initiated from the flowchart block 908, the score threshold would be the second score threshold pertaining to the second pass. If the score is less than the score threshold at issue, then a ground probe is assigned to this location on the circuit board 202, as indicated by a flowchart block 1010, and then the flowchart 1000 proceeds to flowchart block 1012. If the score is not less than (greater than or equal to) the score threshold at issue, then the methodology envisions proceeding to a flowchart block 1012.

At the flowchart block 1012, it is determined whether the number of ground probes selected is less than the number (first, second, or third count threshold) needed to initiate the particular pass (first, second, or third pass, respectively). If the answer is affirmative, then the number of selected ground probing locations is still insufficient, and the methodology envisions proceeding to the flowchart block 1002, where another ground probing location is retrieved for consideration. In the alternative, the number of selected ground probing locations is sufficient and the methodology will stop and return to one of flowchart blocks 904, 908 or 912, whichever the case may be.

Figure 11:
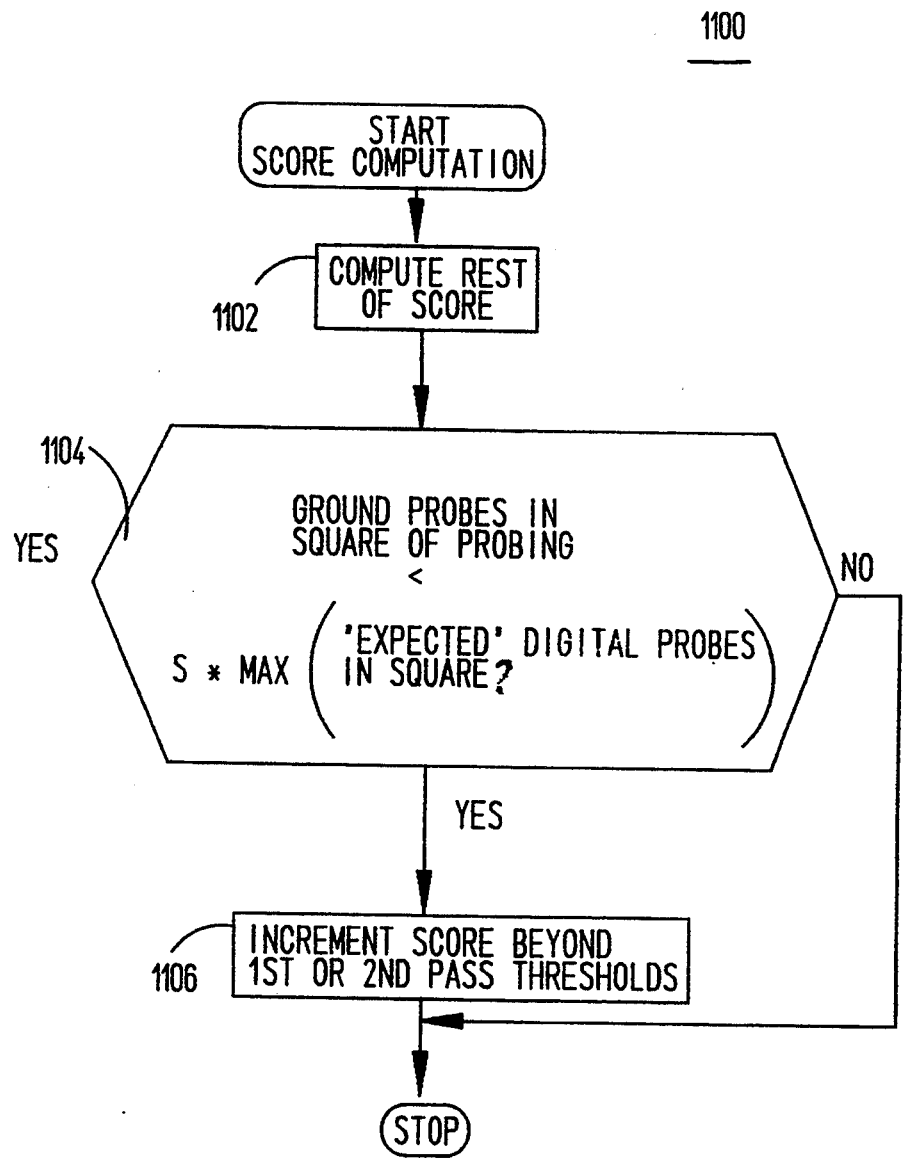
FIG. 11 shows a flowchart for computing scores pertaining to potential ground probe locations, in accordance with the present invention.

FIG. 11 illustrates a flowchart 1100 pertaining to score computation as specified in the flowchart block 1008 of FIG. 10. With reference to FIG. 11, at a flowchart block 1102, the score for the particular ground probing location is computed just as in the existing Probe Select program, as described hereinbefore. Recall that the score for a ground probing location is increased for every time that the modified or existing Probe Select program discovers something about the probing location that is less than optimal. In other words, ground probing locations with low scores make better choices for ground probes.

The remainder of the flowchart 1100 is considered by the inventors to be a feature of the present invention. After the score computation, the methodology performs a novel determination, as indicated in a flowchart block 1104.

At the flowchart block 1104, it is determined whether the ground probing locations in a grid square associated with the probing location is less than a fourth threshold, which pertains to the test signal probes. In accordance with the present invention, the fourth threshold is defined and computed as follows:

fourth threshold = 5 * max (expected test signal probes in square, test signal probes in square)

wherein:

expected signal probes = $\Sigma p(i)$ $$p(i) = \frac{\text{probability of test signal probe being placed at node } (i)}{} = \frac{\text{number of test signal probes required for node } (i)}{\text{number of test signal probes already on node } (i)}$$

The "expected" number of test signal probing locations and the actual count of test signal probing locations are both used. There is no way to guarantee that all test signal probing locations have been selected at the time the ground probing locations are selected, so the "expected" number of test signal probing locations is used as an estimate of how many test signal probing locations will be accorded to each imaginary grid square. If during the time that the ground probing locations are selected, the particular grid square already has more test signal probing locations in it than predicted by the "expected" count, the actual number becomes a better predictor of the number of test signal probing locations that will end up in the imaginary grid square.

If the number of ground probes is less than the fourth threshold, then the methodology envisions stopping and returning to the flowchart block 1006 of FIG. 10. Alternatively, if the number of ground probes is less than the fourth threshold, then the methodology envisions proceeding to a flowchart block 1106.

At the flowchart block 1106, the score is incremented beyond the first and second score thresholds. In other words, the amount of increase in the score is such that the overall score of the ground probing location is guaranteed to be above both of the first and the second score thresholds pertaining to the first or second passes, respectively, of ground probe selection flowchart 1000 specified in FIG. 10. The result is that such a ground probing location would only be used for a ground probe pursuant to the methodology if the methodology gets to the final third pass of ground probe selection flowchart 1000 without having selected the required number of ground probing locations.

The preferred embodiment was chosen and described in order to best explain the principles of the present invention and its practical application to those persons skilled in the art and to thereby enable those persons skilled in the art to best utilize the present invention in various embodiments and with various modifications as are suited to the particular use contemplated. It is intended that the scope of the present invention be broadly defined by the following claims.

We claim:

1. A method for setting up a short-wire board test fixture by positioning a plurality of ground probes relative to a plurality of positioned test signal probes, to reduce ground bounce during a testing of a circuit board, the method comprising the steps of:
   1) placing the circuit board to be tested on the short-wire board test fixture;
   2) defining a grid of squares on the circuit board to subdivide the test signal probes into groups, such that each group of test signal probes is in only one square;
   3) determining the number of test signal probes within each of said groups;
   4) determining the number of ground probes to be positioned in each square so that no more than five test signal probes exist for each ground probe within each of said groups;
   5) selecting a maximum distance to be maintained when positioning ground probes adjacent to test signal probes; and
   6) positioning said ground probes in the short-wire board test fixture relative to said test signal probes so that each test signal probe is within said maximum distance of at least one of said ground probes to thereby reduce ground bounce during testing of the circuit board.

2. The method of claim 1, further comprising the steps of:
   (a) identifying an electrical node of the circuit board;
   (b) comparing the number of selected ground probe locations with a first count threshold, said first count threshold equal to five times a theoretical minimum, said theoretical minimum equal to the number of test signal probes divided by five, plus power supply needs of the circuit board;
   (c) terminating the selection of ground probe locations when said first number is greater than said first count threshold, or alternatively, selecting more ground probe locations for said electrical node;
   (d) comparing a second number of selected ground probe locations with a second count threshold, said second count threshold equal to two times said theoretical minimum;
   (e) terminating the selection of ground probe locations when said second number is greater that said second count threshold, or alternatively, selecting more ground probe locations for said electrical node;
   (f) comparing a third number of selected ground probe locations with a third count threshold, said third count threshold equal to one times said theoretical minimum; and
   (g) terminating the selection of ground probe locations when said third number is greater that said third count threshold, or alternatively, selecting more ground probe locations for said electrical node.

3. (Amended) The method of claim 1, wherein said maximum distance is approximately one inch.

4. The method of claim 1, wherein said squares measure approximately 1.4 inches by 1.4 inches.

5. The method of claims 2, wherein selecting probe locations in steps (c), (e), and (g), further comprises the steps of:
   (i) identifying a probe location on said electrical node;
   (ii) computing a score for said probe location;
   (iii) comparing said score with a score threshold;
   (iv) assigning a ground probe at said probe location when said score is less than said score threshold;
   (v) comparing the number of assigned ground probes with the corresponding said count threshold;
   (vi) returning to one of steps (b), (d), or (f) of claim 3, or alternatively, selecting another probe location and returning to step (i).

6. The method of claim 5, further comprising in step (ii) the steps
   determining whether the number of assigned ground probes is greater than or equal to five times ether the actual or expected number of test signal probes, whichever is greater, residing within said given square; and
   increasing the score of the round probe location if this is the case.

7. The method of claim 6, further comprising in step (ii) the steps of computing said expected number of test signal probes by adding all of the probabilities corresponding to said test signal probes which could potentially be positioned within said given square.

* * * * *

UNITED STATES PATENT AND TRADEMARK OFFICE
CERTIFICATE OF CORRECTION

PATENT NO. : 5,389,874
DATED : February 14, 1995
INVENTOR(S) : Philip N. King, et. al.

It is certified that error appears in the above-identified patent and that said Letters Patent is hereby corrected as shown below:

Column 13, line 1, Claim 1: After "3" insert -- ) --;

Column 14, line 35, Claim 3: Delete "(Amended)";

Column 14, line 39, Claim 5: Change "claims" to -- claim--;

Column 14, line 54, Claim 6: After "steps" insert -- of --;

Column 14, line 60, Claim 6: Delete "round" and insert therefor --ground--

Column 14, line 62-63, Claim 7: Delete "in step (ii) the steps" and insert therefor -- the step--.

Signed and Sealed this

Seventh Day of April, 1998

*Attest:*

BRUCE LEHMAN

*Attesting Officer*   *Commissioner of Patents and Trademarks*